United States Patent [19]

Bean et al.

[11] Patent Number: 4,492,971
[45] Date of Patent: Jan. 8, 1985

[54] METAL SILICIDE-SILICON HETEROSTRUCTURES

[75] Inventors: John C. Bean, New Providence, N.J.; Kin-Chung R. Chiu, Mountain View, Calif.; John M. Poate, Summit, N.J.

[73] Assignee: AT&T Bell Laboratories, Murray Hill, N.J.

[21] Appl. No.: 156,649

[22] Filed: Jun. 5, 1980

[51] Int. Cl.³ ............................................. H01L 29/48
[52] U.S. Cl. ............................................. 357/15; 357/4
[58] Field of Search ..................... 357/15 R, 15 A, 4

[56] References Cited

U.S. PATENT DOCUMENTS 4,127,861 11/1978 Deneuville ............................. 357/15
4,128,670 12/1978 Gaensslen ........................ 397/15 X
4,316,209 2/1982 Ho et al. ............................. 357/15 X

OTHER PUBLICATIONS

Tu et al., *J. Appl. Phys.* Suppl. 2, Pt. 1, 1974, Proc. 6th Int. Vacuum Congr. 1974, pp. 669–672.
Tung et al., *Thin Solid Films,* 93 (1982).

*Primary Examiner*—Martin H. Edlow
*Attorney, Agent, or Firm*—Eugen E. Pacher

[57] ABSTRACT

Described are semiconductor heterostructures incorporating a metal layer. Devices based on the heterostructures are described, as are techniques for preparing the heterostructures. Specific embodiments wherein the metal layer is a metal silicide are detailed, and hot electron devices using this structure are analyzed briefly.

7 Claims, 5 Drawing Figures

U.S. Patent   Jan. 8, 1985   4,492,971
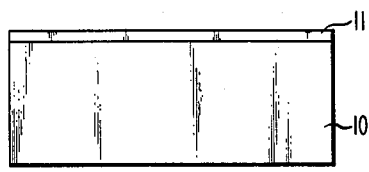
FIG. 1
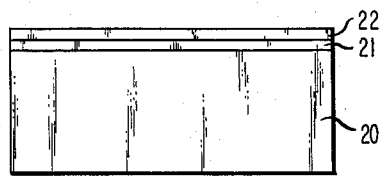
FIG. 2
FIG. 3
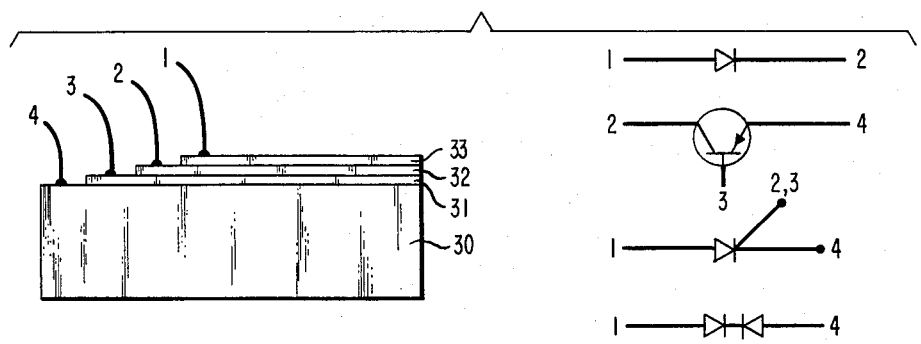
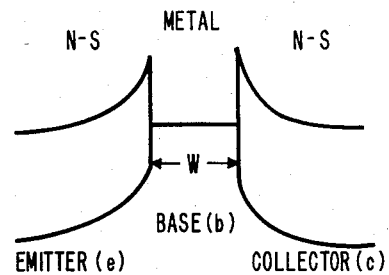
FIG. 4
FIG. 5
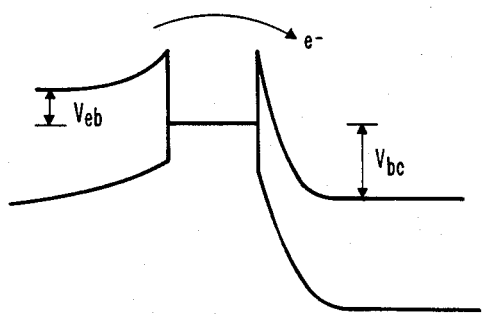

METAL SILICIDE-SILICON HETEROSTRUCTURES

BACKGROUND OF THE INVENTION

From the beginning of semiconductor device technology, physicists have postulated a host of semiconductor heterostructures, i.e., combinations of layers of different semiconductor materials in a single composite crystal. The fascination in this kind of structure is traceable to the nearly infinite selection of electrical properties thus potentially available to device designers. The early visions of a wide variety of hetero combinations were never realized. It is now recognized that semiconductor heterostructures with perfection suitable for state of the art devices are extremely difficult to produce. An approach that has proved successful, and is widely used, is that of combining III–V or II–VI semiconductors with ternary materials in the same system, e.g., GaAs and GaAlAs. Layers with slightly different amounts of the ternary addition can be graded to reduce the effect of the compositional discontinuity. Such structures are used widely in optoelectronic devices.

To date, all of the heterostructures that have met with technological success have been combinations of semiconductor materials.

SUMMARY OF THE INVENTION

We describe here, for the first time, a true device-quality, semiconductor heterostructure incorporating a metal layer. We describe, also for the first time, a three layer semiconductor heterostructure and other multilayer structures incorporating a metal layer. And finally we describe new techniques for preparing these structures.

BRIEF DESCRIPTION OF THE DRAWING

FIG. 1 is a schematic representation of a two-layer heterostructure, a subassembly broadly useful in a wide variety of electrical, optical and electro-optic devices;

FIG. 2 is a schematic representation of a three-layer heterostructure which, in a preferred embodiment of the invention, incorporates the structure of FIG. 1;

FIG. 3 is a schematic representation of a four-layer heterostructure which provides the option of building devices incorporating, as active electrical elements, all of the layers, or alternatively either a metal-semiconductor-metal heterostructure or a semiconductor-metal-semiconductor heterostructure;

FIG. 4 is an energy level diagram depicting the probability of transmission of electrons in an electrical device modeled after the structure of FIG. 3 but with no electrical bias applied; and FIG. 5 is a diagram similar to that of FIG. 4 with electrical bias applied.

The following detailed description is framed around a silicon-metal silicide heterostructure. However, it should be appreciated at the outset that the structures and techniques described here are fundamental in many respects, and have potentially wide application to other material systems and to devices and uses other than those specifically indicated.

DETAILED DESCRIPTION

We describe here a new approach to the synthesis of compounds. It involves simultaneous compound formation and single crystal growth. Although the details that follow are described in connection with the formation of nickel silicide, we except that other compound systems are thermodynamically and crystallographically suited to this synthesis technique. Therefore we present first a general description of the technique.

A feature of the technique is a vapor solid interaction between a single crystal solid of composition A and a vapor comprising B, at a temperature and pressure which favors a reaction of A with B to form a stoichiometric compound $A_xB_y$ and favors also formation of the compound as a single crystal. The designations are for convenience. A represents typically a metal or semiconductor but necessarily one having an essentially single crystal structure matching the structure of $A_xB_y$. B represents a material that is a vapor at the aforementioned temperature. We know of no existing technologically important process that meets this general description. However general it may be, we consider its application to metal silicide heterostructures to be especially significant. Accordingly the remainder of this disclosure will deal specifically with silicides. More particularly we present embodiments directed to nickel silicide and cobalt silicide as we believe that heterostructures incorporating those compounds offer promise for high quality device applications.

FIG. 1 schematically represents a basic two-layer heterostructure made according to one aspect of the invention. It shows an essentially single crystal silicon substrate 10 with an overlying layer 11 of essentially single crystal metal silicide. We have succeeded in producing metal silicide layers with a crystal perfection unattainable by prior art methods.

We now describe the technique we used to form the metal silicide layers. It is our belief that an important aspect of this technique in terms of producing high quality material is the formation of the desired silicide compound directly. For clarity in exposition we describe the specific case of nickel silicide. Nickel and silicon form a number of compounds, $Ni_2Si$, $NiSi$, $NiSi_2$ of which only the silicon rich $NiSi_2$ phase has the requisite crystal structure to grow epitaxially on silicon. By depositing nickel on a heated, clean, crystallographically ordered silicon substrate, the first atoms are forced to immediately form the $NiSi_2$ phase. This occurs both because the first nickel atoms see an overabundance of Si and because the temperature is carefully adjusted for formation of the $NiSi_2$ phase. This process will not be reproduced if one heats a silicon/nickel layered structure, as the reaction proceeds by formation of $Ni_2Si$, followed by NiSi with ultimate production of $NiSi_2$.

In order that the silicide form as a single crystal, according to one aspect of the invention, it is obviously desirable that the compound form in a crystal structure compatible with that of the original solid material and with appropriately matched lattice dimensions. Single crystal silicon forms in a cubic structure with a lattice constant of 5.43 Angstroms and nickel silicide forms a diamond lattice with a constant of 5.39. Cobalt silicide, ($CoSi_2$) with a lattice constant of 5.35, also matches well with silicon. While cobalt silicide and nickel silicide thus form a preferred category of materials within the scope of the invention we expect that similar results can be obtained with other silicide forming metals.

The specific procedure we used to demonstrate the formation of single crystal silicide is the following. Silicon substrates are first cleaned by ion sputtering and annealed within the vacuum apparatus leaving a pure ordered silicon surface. Substrates are then heated to 550–850 degrees C. at which point the substrates are exposed to a nickel evaporation source. This leads to the formation of a crystalline $NiSi_2$ layer the growth of which is terminated by closing the nickel source. The nickel silicide can also be grown by co-depositing nickel and silicon, preferably at approximately a 1 to 2 ratio.

The crystal morphology of silicide films prepared in the foregoing manner has been inferred from Rutherford backscattering and channeling techniques. In typical examples, temperature of deposition, deposition rate and silicon to nickel ratio were approximately 650 degrees C., approximately 1 Angstrom per second, and two to one respectively, in each case. The ratio of backscattering yield for the channeling direction to yield in a random direction is the well known measure of crystal perfection; $\chi_{min}$. The values obtained were 4.5% for the (111) substrate and 10% for the (100) substrate. These values are close to those expected in perfect single crystal. The latter value, 10%, represents a nominal figure of merit that is convenient to distinguish in terms of results the invention from other approaches.

We have found that deposition on the (111) silicon surface gives the most advantageous results. Growth on the (100) face appears to give excellent surface morphology, except that the Si-$NiSi_2$ interface demonstrates faceting unlike the (111) interface which appears atomically smooth.

With reference again to the drawing, the basic structure of FIG. 1 can be used to advantage in the heterostructure of FIG. 2. Here a silicon substrate 20 is shown with layer 21 of nickel silicide, covered with layer 22 of epitaxial silicon. In principle, layer 22 can be of any material capable of growing epitaxially on the metal silicide. However, the technologically interesting structure is silicon-metal silicide-silicon, in view of the applications soon to be described.

It is important in forming the epitaxial layer 22 that it also be deposited on a heated substrate, but for reasons other than those given earlier in connection with forming layer 21. By depositing Si on heated single crystal $NiSi_2$ the amorphous phase is avoided, and the Si atoms have sufficient surface mobility to immediately crystallize to form a single crystal layer.

It is known that metal silicide transport layers can be used in the formation of single crystal silicon by solid phase epitaxy. In this process silicon is deposited in an amorphous form on a metal or metal silicide coated silicon crystal. The layered structure is then heated. If the transport layer is initially metal, the first result of the heating step is the formation of a metal silicide transport layer. The next result of the heating step is the migration of silicon from the amorphous layer through the transport layer and the deposition of the transported silicon epitaxially on the single crystal silicon substrate. The significance of this prior art process in the context of this description is that the diffusion of amorphous silicon through a solid metal silicide layer overlying a silicon crystal cannot be avoided. This behavior is due to the amorphous Si having a higher free energy than single crystal Si. Thus, the amorphous silicon layer is metastable in the sense that, while heating the silicon to order it epitaxially, the layer disappears. Therefore attempts to form heterostructures by conventional techniques fail. These techniques are described by *Thin Films: Interdiffusion and Reaction*, J. Poate et al, John Wiley & Sons, 1978, pp. 433–468.

According to an aspect of this invention, single crystal silicon is formed in situ on the single crystal silicide layer. By this means we have been able to avoid transport of material back through the silicide layer, and have successfully formed three layer heterostructures with a high degree of crystal perfection. Such structures are capable of functioning in a variety of semiconductor devices.

It should also be recognized that the procedure for forming the epitaxial silicon is unique regardless of the procedure used to form the single crystal metal silicide.

An exemplary procedure for forming the structure represented by FIG. 1, and the structure represented in FIG. 2, will now be described.

The silicon substrate is chemically cleaned using the following sequence of chemical baths: acetone, methanol, $H_2O$, HF, $H_2O$, $NH_4OH:H_2O_2:H_2O$ (Hot), $H_2O$, HF, $HCl:H_2O_2:H_2O$ (Hot), $H_2O$. This produces a clean silicon surface with a layer of <10 Angstroms of $SiO_2$. This substrate is then loaded into the vacuum deposition chamber and the apparatus pumped down to a vacuum of $<10^{-9}$ Torr. Separate silicon and nickel electron beam deposition sources are then turned on and the power adjusted so that the silicon deposition rate is approximately one monolayer per second at the substrate position. The nickel deposition rate is set for a value greater than one half monolayer per second. The silicon substrate is then cleaned in situ by bombardment with 1 kV argon ions for ten minutes at room temperature followed by a ten minute anneal at 850 degrees C. This produces an atomically clean, crystallographically ordered silicon substrate surface. The substrate is then cooled to 650 degrees C. Shutters in front of the silicon and nickel electron beam sources are then opened, initiating deposition of a crystalline $NiSi_2$ layer. At the desired thickness the shutter in front of the nickel source is closed. Deposition of $NiSi_2$ thereore ceases and a crystalline silicon overlayer continues until the silicon source shutter is closed.

It should be understood that the foregoing procedure can be used to produce the double layer heterostructure of FIG. 1 by simply terminating the deposition after the nickel is deposited.

As indicated earlier, the temperature at which the nickel is deposited is important in order to form single crystal silicide material. The range of temperatures recommended is 550 to 850 degrees C. with temperatures in the range of 600 to 700 degrees C. preferred. Also important is the temperature of deposition of the silicon. Here a range of 550 to 750 degrees C. is recommended and temperatures of 600 to 700 degrees C. are preferred. Useful deposition temperatures using cobalt are similar except that due to greater stability of cobalt silicide processing temperatures can exceed those given for nickel by up to 200 degrees C. We have experienced success with deposition rates for the silicide of a few tenths to ten Angstroms per second, and we believe that rates from 0.1 to 100 Angstroms per second are useful. The deposition of silicon may be the same, or faster if desired, up to one hundred or several hundred Angstroms per second.

Various device applications based on the subassembly shown in FIGS. 1 and 2 are described in the device embodiment of FIG. 3. FIG. 3 shows silicon substrate 30 covered with a silicide layer 31, a single crystal silicon layer 32, and another silicide layer 33, each with appropriate electrical contacts 1, 2, 3, and 4 as shown. Electrical functions implicit in this device structure are shown to the right of the figure. Simple Schottky diodes are available between contacts 1 and 2 or 3 and 4. Backto-back diodes, with electrical functions similar to well known pnpn structures, result from interconnecting electrodes 1 and 4. A silicon controlled rectifier can be utilized in conventional manner via contacts 1, 4 and 2 or 3 alternatively. A three-layer transistor structure incorporates layers 2, 3, and 4.

Devices based on the three-layer structure of FIG. 3 are of particular interest. Using the procedures described here and the resulting structures, we can for the first time produce metal base transistors. These devices have been studied theoretically for some time but actual fabrication of devices has been difficult. See, for example, *Solid State Electronics,* Vol. 6, pp. 245-250, 1963; Vol. 8, pp. 673-683 and 979-990, 1965; Vol. 9, pp. 751-769, 1966; and *IEEE Trans. Electron Devices* 10, 299-304, 1963. These devices are known as hot electron devices and typically require very thin base layers. For that reason, it may be most desirable in making the base layer to deposit the silicide forming metal onto the silicon substrate without co-depositing silicon.

Analysis of the three-layer metal base transistor is given in the following section, with reference to FIGS. 4 and 5.

Energy level diagrams for three-layer configurations without and with bias applied are shown in FIGS. 4 and 5, respectively.

In the conventional metal base transistor it is generally assumed that $\omega$ is at least 100-200 Angstroms. However in this case there is appreciable energy loss experienced by a hot electron traversing the base. For this case one can calculate the cumulative quantum mechanical transmission probability as being the decoupled product of a probability of transmission across the e-b potential discontinuity times the transmission probability across the b-c potential discontinuity.

If on the other hand $\omega$ is small compared to the hot electron scattering length in the metal base, the electron energy is approximately constant across the base and the quantum mechanical transmission probability should be treated as the coupled problem of electron transmission over a well.

The QM transmission probability for such a configuration is, $$T_{QM} = 1/[\cos^2 k_2\omega + (k_1^2 + k_2^2)/4k_1^2) \sin^2 k_2\omega]$$

$$k_1 = (2M^*\epsilon/h^2)^{\frac{1}{2}} \quad k_2 = (2M^*(E+\epsilon)/h^2)^{\frac{1}{2}}$$

where
 $M^*$ = the electron effective mass,
 $\epsilon$ = Excess energy of the electron above the e-b barrier,
 E = Semiconductor/metal barrier height,
 h = Planck's constant/$2\pi$.

An important point is that for small $\omega$, $T_{QM}$ has an oscillatory behavior. If $\omega$ is chosen properly, then $T_{QM} \sim 1$, and one would expect the device to exhibit current gain necessary for an integrated device.

For the materials system described here $\epsilon$ is assumed to be approximately kT or 25 meV, E ~ 0.5 eV. Then:

$$T_{QM} \sim 1/[\cos^2 \pi(\omega/20 \text{ Angstroms}) + 5 \sin^2 (\pi(\omega/20 \text{ Angstroms})]$$

From this equation $T_{QM}$ is found to have periodic, but declining, maxima at multiples of 20 Angstroms. The recommended base layer thickness for a device showing gain is a small multiple (1-6) of 20 Angstroms with 40 Angstroms, 60 Angstroms, 80 Angstroms preferred cases. For other applications, e.g., switching devices, this constraint need not be rigorously followed. Moreover, changes in the materials may shift the maximum in $T_{QM}$ and create new optimum dimensions.

Optical devices based on structures described herein may also find useful applications. By depositing alternating layers of silicide and silicon one could constitute a thin film interference filter. Such a device would take advantage of the high infrared transparency of the crystalline silicon layers interposed between the partially reflecting silicide layers.

Various additional modifications and extensions of this invention will become apparent to those skilled in the art. All such variations and deviations which basically rely on the teachings through which this invention has advanced the art are properly considered to be within the spirit and scope of this invention.

We claim:
1. Article comprising a composite structure of:
   a single crystal silicon substrate,
   a single crystal metal silicide layer overlying the silicon substrate,
   and a single crystal silicon layer overlying the metal silicide, said composite structure having an essentially continuous single crystal lattice between the three layers.
2. Article comprising a composite structure of alternating layers of silicon and a metal silicide, said composite structure having a continuous single crystal lattice between said alternating layers.
3. Article of claim 1 or 2 in which the metal silicide is nickel silicide or cobalt silicide.
4. Device comprising:
   a single crystal silicon substrate,
   a single crystal metal silicide layer overlying the silicon substrate,
   a single crystal silicon layer overlying the metal silicide layer, said substrate, metal silicide layer and silicon layer forming a composite structure with a continuous crystal lattice between the layers, and means electrically contacting the substrate, the metal silicide layer and the silicon layer.
5. An optical device comprising the article of claim 2 in combination with means for directing light radiation on said article.
6. Device of claim 4 or 5 in which the metal silicide is nickle silicide or cobalt silicide.
7. Article comprising a composite structure comprising a single crystal silicon substrate and a single crystal metal silicide layer overlying the substrate, with the metal silicide having $\chi_{min}$ no larger than 10%, where $\chi_{min}$ is the ratio of Rutherford backscattering yield for the channeling direction substantially normal to the layer to the yield in a random direction.

* * * * *